United States Patent [19]
Milina

[11] Patent Number: 5,444,921
[45] Date of Patent: Aug. 29, 1995

[54] EDGE BEAD REMOVAL GAP GAUGE

[75] Inventor: Daniel V. Milina, San Jose, Calif.

[73] Assignee: VLSI Technology, Inc., San Jose, Calif.

[21] Appl. No.: 190,420

[22] Filed: Feb. 2, 1994

[51] Int. Cl.⁶ .............................. G01B 5/14; G01B 3/30
[52] U.S. Cl. ........................................ 33/833; 33/613; 33/567
[58] Field of Search ................. 33/832, 833, 626, 642, 33/613, 567, 567.1, 571, 792, 501.08, 562; 437/231; 134/33

[56] References Cited

U.S. PATENT DOCUMENTS

| | | | |
|---|---|---|---|
| 861,582 | 7/1907 | Fildes | 33/562 |
| 4,439,243 | 3/1984 | Titus | 134/33 |
| 4,439,244 | 3/1984 | Allevato | 134/33 |
| 4,685,975 | 8/1987 | Kottman et al. | 134/33 |

FOREIGN PATENT DOCUMENTS 0450119  3/1950  Italy ........................................ 33/567

*Primary Examiner*—Alvin Wirthlin
*Attorney, Agent, or Firm*—Patrick T. King

[57] ABSTRACT

An apparatus and method for determining the distance of a semiconductor wafer from a nozzle of an edge bead removal system. A rotationally adjustable gap gauge is placed over a vacuum chuck of an edge bead removal system. The gap gauge has a ramped surface which is located proximate to the nozzle when the gap gauge is placed over the vacuum chuck. By rotating the gap gauge on the vacuum chuck, the ramped surface is brought closer to the nozzle. When the nozzle contacts the ramped surface, the position of the gap gauge, as shown by calibration marks on the gap gauge, are recorded. The calibration marks on the gap gauge indicate the corresponding distance that will exist between the nozzle and the backside of a semiconductor wafer when the gap gauge is removed and a semiconductor wafer is placed onto the vacuum chuck. The edge bead removal system is then adjusted such that a desired distance will exist between the nozzle and a semiconductor wafer when a semiconductor wafer is placed onto the vacuum chuck. In so doing, the present claimed invention provides for uniform quantitative measurement of the gap distance between a nozzle and the backside of a semiconductor wafer in an edge bead removal system.

6 Claims, 3 Drawing Sheets

EDGE BEAD REMOVAL GAP GAUGE

BACKGROUND OF THE INVENTION

1. Field of the Invention

The present claimed invention relates to the field of semiconductor wafer fabrication. More specifically, the present claimed invention relates to the measurement of the distance from the backside of a semiconductor wafer to a nozzle of an edge bead removal system.

2. Prior Art

During conventional applications of photoresist coatings to semiconductor wafers, a "coater" system is used. One part of the coater system is a flat, circular, disk-shaped, rotating vacuum chuck having a diameter slightly less than that of a semiconductor wafer. The vacuum chuck is used to hold and rotate a semiconductor wafer during the photoresist application process. The vacuum chuck is oriented such that a semiconductor wafer placed thereon resides in a level horizontal plane. In operation, the backside or inactive surface of a semiconductor wafer is placed onto the vacuum chuck. The vacuum chuck applies a suction or negative pressure to the backside of the semiconductor wafer to hold the semiconductor wafer on the vacuum chuck.

In standard coater system 3, an axle extends downward from the vacuum chuck and is powered by motors to rotate the vacuum chuck. The axle of the vacuum chuck has a collar placed thereover. Attached to the collar is a nozzle which extends upwardly with the tip of the nozzle located in a position which will be in close proximity to the outer edge of the backside of a semiconductor wafer when a semiconductor wafer is placed on the vacuum chuck. A set screw on the collar allows the position of the collar to be adjusted so that the gap distance, the distance of the nozzle from the outer edge of the backside of a semiconductor wafer, can be varied. The vacuum chuck, collar, and nozzle are all enclosed within a shroud. The shroud collects, in a drain cup, excess fluids which are generated during the photoresist application process.

While the semiconductor wafer is being rotated on the vacuum chuck, a desired amount of liquid photoresist is applied to the center of the semiconductor wafer. While the semiconductor wafer is rotating, the photoresist material spreads radially outward from the center of the semiconductor wafer towards the edge of the semiconductor wafer such that the entire top or active surface of the wafer is coated with a layer of photoresist. However, excess amounts of photoresist tend to accumulate and form a mound or bead of photoresist on the outer edge of the semiconductor wafer. In order to eliminate the "edge bead" of photoresist, a nozzle which dispenses a solvent referred to as edge bead removal fluid, is used. During the dispersal of the edge bead removal solvent, the vacuum chuck, collar, and nozzle are commonly referred to as an edge bead removal system. The edge bead removal fluid is dispersed from the nozzle towards the outer edge of the backside of the semiconductor wafer.

Although the edge bead removal fluid is directed at the backside of the semiconductor wafer, due to the viscous nature of the edge bead removal fluid, under proper conditions the fluid will "curl" around to the top surface of the semiconductor wafer and remove the bead of excess photoresist material. However, the effectiveness of the edge bead removal system is highly dependent upon the edge bead removal gap distance separating the nozzle from the outer edge of the backside of the semiconductor wafer.

In order to set the gap distance, the vacuum chuck, collar, and nozzle must be lifted higher than the shroud so that the vacuum chuck, collar, and nozzle are visible to the user. Standard coater systems allow the vacuum chuck, collar, and nozzle to be lifted to accommodate adjustments to the collar and gap distance. The user then estimates or "eyeballs" the gap distance and makes adjustments as are deemed necessary. After each adjustment, test runs of semiconductor wafers are made to determine the effectiveness of the edge bead removal system. Repeated adjustments and test runs are made until an acceptable result is obtained. As a result, considerable time is spent determining optimum gap distance and considerable cost in test semiconductor wafers is incurred.

In addition to adjusting the gap distance, changes may be made to the pressure at which the edge bead removal fluid is dispersed from the nozzle, and the speed, revolutions per minute, at which the semiconductor wafer is rotated during the edge bead removal process. Unfortunately, when a user attempts to correct the gap distance to maximize edge bead removal system effectiveness, prior adjustments made to the fluid dispersal pressure, and changes in the speed of rotation of the semiconductor wafer must be taken into account. Furthermore, variances in estimated optimum gap distance between different users must also be taken into account when trying to properly set-up or correct edge bead removal gap distances.

Thus, the need has arisen to quickly obtain optimum edge bead removal system effectiveness, which does not require repeated eyeballing and adjustments, does not waste costly semiconductor wafers on repeated test runs, does not require adjustments to edge bead removal fluid dispersal pressures, does not require changes to semiconductor wafer rotation speed, and which provides uniformity of results even among different subsequent users.

SUMMARY OF THE INVENTION

It is therefore an object of the present invention to provide optimum edge bead removal system effectiveness, which does not require repeated eyeballing and adjustments, does not waste costly semiconductor wafers on repeated test runs, does not require adjustments to edge bead removal fluid dispersal pressures, does not require changes to semiconductor wafer rotation speed, and which provides uniformity of results even among different subsequent users. The above object has been achieved with a rotationally adjustable gap gauge.

In one embodiment of the present claimed invention, a circular recessed area is centrally located within the bottom surface of the gap gauge. The circular recessed area extends into the bottom surface of the gap gauge to a planar surface. A ramped surface is formed on the gap gauge peripherally surrounding the circular recessed area. The ramped surface has a first end which is flush with the bottom surface of the gap gauge, and a second end which is flush with the planar surface of the circular recessed area. The ramped surface makes a single revolution around the circular recessed area from the first end to the second end, so that the distance which the ramped surface extends into the bottom surface of the gap gauge towards the planar surface varies with the position of the ramped surface around the circular recessed area. A handle located on the top surface of the gap gauge is used to rotate the gap gauge.

The gap gauge is placed over a vacuum chuck in an edge bead removal system with the vacuum chuck inserted into the circular recessed area. When the gap gauge is located over the vacuum chuck, the ramped surface is located proximate to the nozzle. By rotating the gap gauge on the vacuum chuck, the distance from the ramped surface to the nozzle is varied. When the nozzle contacts the ramped surface, the position of the gap gauge, as shown by calibration marks on the gap gauge, is recorded. The calibration marks on the gap gauge indicate the corresponding gap distance that will exist between the nozzle and the backside of a semiconductor wafer when the gap gauge is removed and a semiconductor wafer is placed onto the vacuum chuck.

The edge bead removal system is then adjusted such that a desired gap distance will exist between the nozzle and a semiconductor wafer when a semiconductor wafer is placed onto the vacuum chuck. In so doing, the present claimed invention provides for uniform quantitative measurement of the gap distance between a nozzle and the backside of a semiconductor wafer in an edge bead removal system even among subsequent users. Additionally, the present claimed invention does not require repeated eyeballing and adjustments, does not waste costly semiconductor wafers on repeated test runs, does not require adjustments to edge bead removal fluid dispersal pressures, and does not require changes to semiconductor wafer rotation speed.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
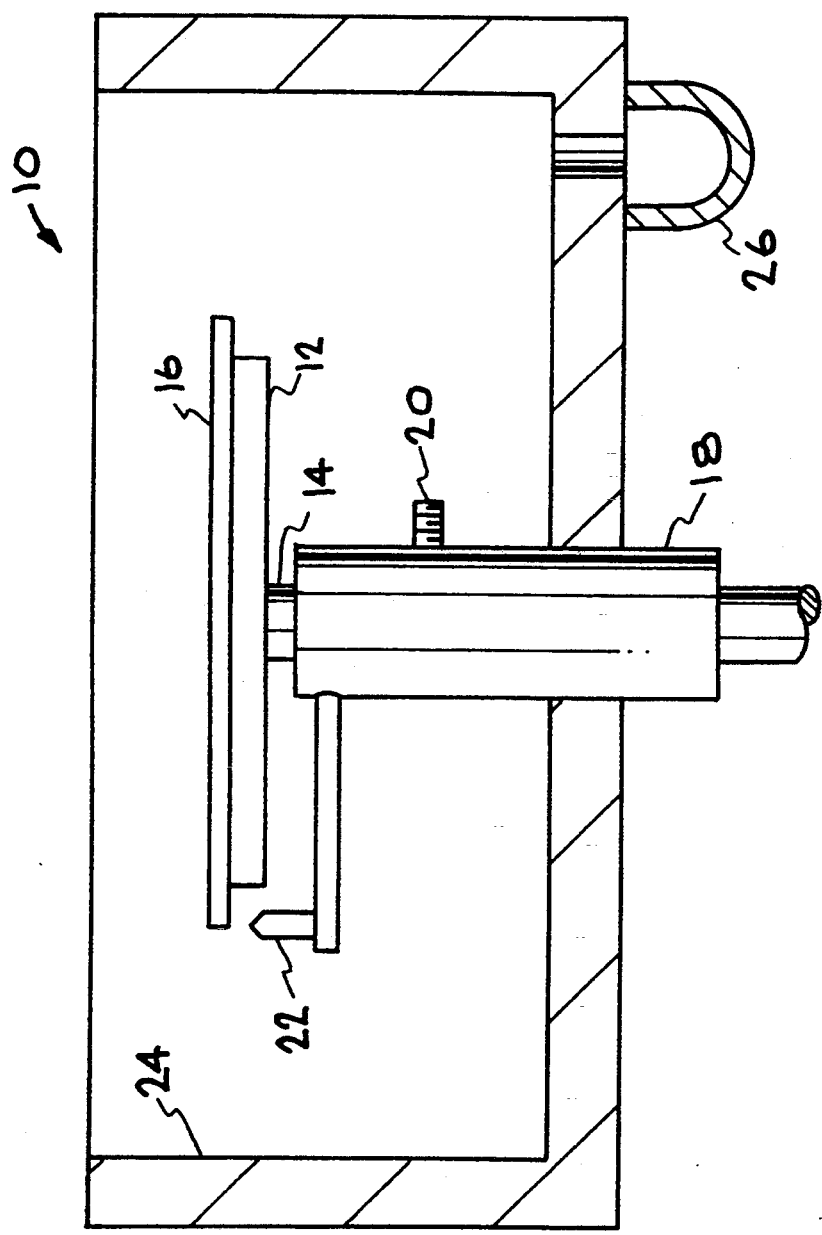
FIG. 1 is a partial cut-away view of a conventional Prior Art coater system having a semiconductor wafer located on a vacuum chuck.

With reference now to FIG. 1, a partial cut-away view of a conventional Prior Art coater system having a semiconductor wafer located on a vacuum chuck is shown. The following description of the present invention will begin with a detailed description setting forth the mechanical structure of the present claimed invention. This description will then be followed by a detailed description setting forth the operation of the present invention.

With reference again to FIG. 1, a conventional coater system 10 is shown. A vacuum chuck 12 is located in the center of coater system 10. An axle 14 extends downwardly from vacuum chuck 12 and is coupled to drive means such as, for example, motors, not shown. A semiconductor wafer 16 is located on the top surface of vacuum chuck 12. As shown in Prior Art FIG. 1, vacuum chuck 12 has a diameter which is slightly less than that of semiconductor wafer 16. The backside of semiconductor wafer 16 is placed onto the top surface of vacuum chuck 12. Vacuum chuck 12 applies suction or negative pressure to hold semiconductor wafer 16 securely attached thereto as vacuum chuck 12 is rotated about axle 14.

Referring still to FIG. 1, a collar 18 is coupled to axle 14 using a set screw 20. Collar 18 remains stationary as vacuum chuck 12 and attached semiconductor wafer 16 are rotated about axle 14. A nozzle 22 extends outwardly from collar 18 with the tip of nozzle 22 located proximate to the outer edge of the backside of semiconductor wafer 16. The distance from the tip of nozzle 22 to the outer edge of the backside of semiconductor wafer 16 is referred to as the "gap distance." Set screw 20 allows the gap distance to be adjusted by raising or lowering collar 18 along axle 14. A shroud 24 peripherally surrounds the entire system. Shroud 24 also contains a drain cup 26 for collecting excess fluid generated during operation of the system.

Figure 2:
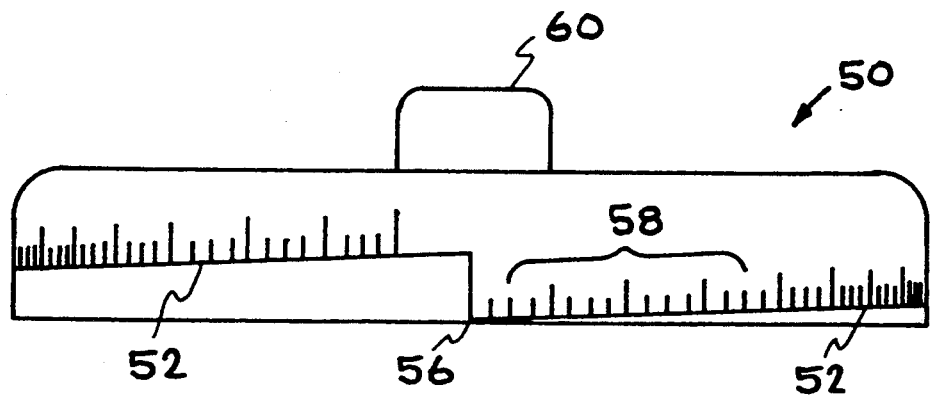
FIG. 2 is a side view of a gap gauge in accordance with the present claimed invention.

With reference next to FIG. 2, a side view of the gap gauge 50 of the present claimed invention is shown. In the present embodiment, gap gauge 50 is formed of a single piece of lightweight material such as, for example, aluminum. Gap gauge 50 has a ramped surface 52 formed into the bottom surface thereof. Ramped surface 52 makes one complete revolution around gap gauge 50. Ramped surface 52 begins flush with the bottom surface of gap gauge 50 at point 56 and gradually extends farther into the bottom surface of gap gauge 50 as ramped surface 52 proceeds around the periphery of gap gauge 50. Therefore, as shown in FIG. 2, ramped surface 52 has extended the greatest distance into the bottom surface of gap gauge 50 just before reaching point 56.

With reference still to FIG. 2, calibration marks typically shown as 58 indicate the depth ramped surface 52 extends into the bottom surface of gap gauge 50 at any location around gap gauge 50. A handle 60 is located on the top surface of gap gauge 50. A circular recessed area, not shown, is also centrally located in the bottom surface of gap gauge 50. The circular recessed area extends into the bottom surface of gap gauge 50 a distance equal to the greatest distance which ramped surface 52 extends into the bottom surface of gap gauge 50. That is, the circular recessed area extends into the bottom surface of gap gauge 50 the same distance ramped surface 52 extends into the bottom surface of gap gauge 52 just before reaching point 56.

Figure 3:
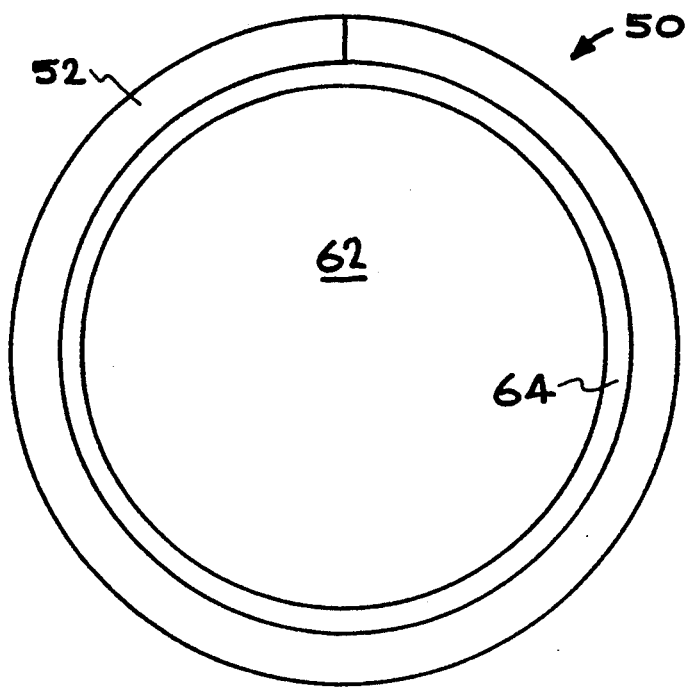
FIG. 3 is a bottom view of the gap gauge of FIG. 2 in accordance with the present claimed invention.

Referring next to FIG. 3 a bottom view of gap gauge 50 of FIG. 2 is shown. The circular recessed area 62 is formed into the bottom surface of gap gauge 50, and is peripherally surrounded by ramped surface 52. Circular recessed area 62 has a diameter slightly larger than that of vacuum chuck 12. The remaining portion of the bottom surface of gap gauge 50 is shown by bottom portion 64.

IN OPERATION

Figure 4:
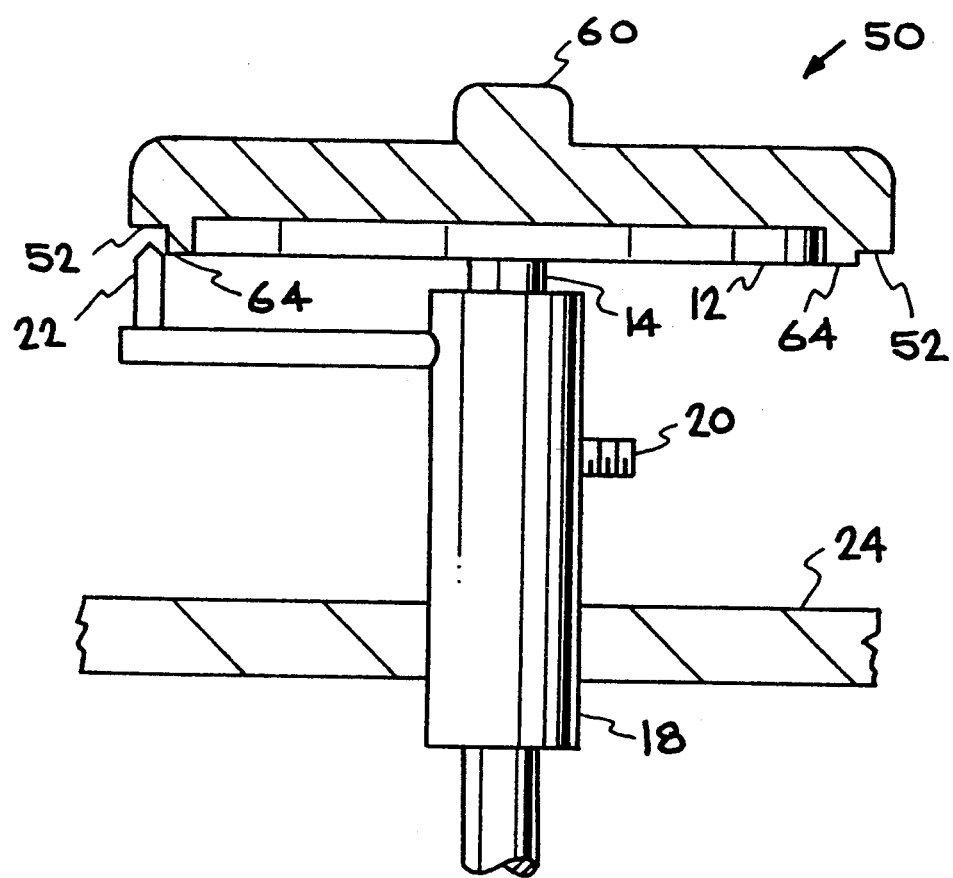
FIG. 4 is a partial cut-away view of the present claimed invention in operation with the gap gauge placed over a vacuum chuck in accordance with the present claimed invention.

The following is a detailed description of the operation of the present invention. With reference now to FIG. 4, a partial cut-away view of the present invention in operation is shown. In operation, gap gauge 50 is placed over top surface of vacuum chuck 12 with vacuum chuck 12 inserted into circular recessed area 62 of FIG. 3. Bottom surface 64 surrounds vacuum chuck 12 thereby keeping gap gauge 50 fixed over vacuum chuck 12. As shown in FIG. 4, when gap gauge 50 is placed over vacuum chuck 12, ramped surface 52 is located proximate to the end of nozzle 22. That is, when gap gauge 50 is placed over vacuum chuck 12, ramped surface 52 is positioned approximately where the outer edge of the backside of a semiconductor wafer 16, as shown in FIG. 1, would be located when the wafer is situated on vacuum chuck 12.

With reference still to FIG. 4, gap gauge 50 is rotated on vacuum chuck 12 by turning handle 60. As handle 60 is rotated, the distance between ramped surface 52 and the tip of nozzle 22 is varied. In the present embodiment, gap gauge 50 is rotated until ramped surface 52 contacts nozzle 22. In most cases, gap gauge 50, vacuum chuck 12, attached collar 18 and nozzle 22, and axle 14 are all lifted by the user so that gap gauge 50 is not obstructed from view by the vertical wall portions, not shown, of shroud 24. The user then observes the calibration marks 58 of FIG. 2 at the point where nozzle 22 contacts ramped surface 52. In the present embodiment, calibration marks 58 of FIG. 2, at the point where nozzle 22 contacts ramped surface 52, indicate the gap distance which will exist between a nozzle and the outer edge of the backside of a semiconductor wafer located on vacuum chuck 12. Thus, the present claimed invention provides a quick and easy quantitative measurement of the gap distance in an edge bead removal system. That is, by employing the present claimed invention, the user does not have to "eyeball" or estimate the gap distance, but, rather, can precisely and directly determine the gap distance in any edge bead removal system. Furthermore, the present claimed invention provides for a uniform determination of gap distance even among subsequent users. Although such calibration marks are used in the present embodiment, the present claimed invention is also well suited to other calibration types. For example, gap gauge 50 could be marked with "good" and "no good" regions to be used by non-technical personnel to determine whether or not a gap distance is within an acceptable range.

With reference again to FIG. 4, gap gauge 50, provides several benefits besides quick and easy quantitative measurement of the gap distance in an edge bead removal system. Specifically, gap gauge 50 eliminates the need for less reliable adjustments to such parameters as nozzle dispersal pressure, and wafer rotation speed. By allowing the user to immediately and precisely determine the gap distance, the user is then able to adjust the position of collar 18 about axle 14 using set screw 20, to generate the gap distance which is considered appropriate for the edge bead removal system (Typically, an edge bead removal system will specify a gap distance in the range of approximately 0.3 mm to 1.5 mm.). Thus, the user can obtain the suggested gap distance and will not tamper with nozzle dispersal pressure or wafer rotation speed in an attempt to overcome an incorrect gap distance.

Referring still to FIG. 4, gap gauge 50 achieves additional substantial improvements over eyeballing techniques used in the prior art. Gap gauge 50 of the present claimed invention eliminates the need for test runs using costly semiconductor wafers. That is, because the present claimed invention provides a direct quantitative measurement of gap distance there is no need for test runs of semiconductor wafers to determine whether or not a correct gap distance has been obtained. In so doing, manufacturing costs are brought down, and the need for costly reworks of semiconductor wafers is reduced. Additionally, by obtaining the correct gap distance excessive removal of photoresist from the semiconductor wafer is eliminated. Because photoresist may cost as much as several thousands of dollars a gallon, the elimination of waste of photoresist reduces wafer fabrication costs. Also, the present claimed invention allows users to "fine tune" edge bead removal systems to allow for variations types of photoresist etc . . . , and allows such fine tuning to be repeated by subsequent users simply by allowing users to record optimum gap distances for any set of given conditions.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. An apparatus for determining the distance of a semiconductor wafer from an edge bead removal nozzle comprising:

a rotationally adjustable gap gauge having a top and bottom surface, said gap gauge further comprised of;

a circular recessed area centrally located within said bottom surface of said gap gauge, said circular recessed area extending a first distance into said bottom surface of said gap gauge to a planar surface disposed within said bottom surface of said gap gauge, and a ramped surface disposed on said bottom surface of said gap gauge peripherally surrounding said circular recessed area, said ramped surface having a first end and a second end, said first end of said ramped surface positioned flush with said bottom surface of said gap gauge, said second end of said ramped surface extending into said bottom surface of said gap gauge such that said second end is flush with said planar surface, said ramped surface disposed making a single revolution around said circular recessed area, said ramped surface configured such that the distance which said ramped surface extends into said bottom surface of said gap gauge towards said planar surface varies with the position of said ramped surface around said circular recessed area.

2. The apparatus of claim 1 further comprising calibration means disposed on said gap gauge for indicating the distance which said ramped surface extends into said bottom surface of said gap gauge at each position around said circular recessed area.

3. The apparatus of claim 1 wherein said circular recessed area has a diameter approximately equal to the diameter of a vacuum chuck used in an edge bead removal system.

4. The apparatus of claim 1 wherein said ramped surface extends a sufficient distance radially outward from said circular recessed area such that said ramped surface is adapted to be positioned proximate to a nozzle of an edge bead removal system when said gap gauge is place over the top surface of a vacuum chuck of said edge bead removal system with said vacuum chuck disposed within said circular recessed area of said gap gauge.

5. A method for determining the distance of an edge bead removal nozzle from the backside of a semiconductor wafer in an edge bead removal system comprising the steps off
placing a vacuum chuck of an edge bead removal system into a circular recessed area centrally located in the bottom side of a rotationally adjustable gap gauge such that a ramped surface of said gap gauge is arranged proximate to a nozzle of said edge bead removal system,
rotating said gap gauge until said ramped surface contacts said nozzle,
recording the rotational position of said gap gauge and determining the corresponding distance of said nozzle from the position of a backside of a semiconductor wafer when said semiconductor wafer is located on said vacuum chuck of said edge bead removal system, and
adjusting said edge bead removal system in accordance with said rotational position of said gap gauge such that a desired distance from said nozzle to said backside of said semiconductor wafer when said semiconductor wafer is located on said vacuum chuck of said edge bead removal system is obtained.

6. An edge bead removal gap gauge system comprising: an edge bead removal system, said edge bead removal system comprising,
rotating vacuum chuck means for securely retaining a semiconductor wafer thereon,
nozzle means for applying solvent to the backside of said semiconductor wafer as said vacuum chuck means rotates said semiconductor wafer, said nozzle means disposed proximate to said vacuum chuck means, and
a rotationally adjustable gap gauge removably couplable to said vacuum chuck means, said gap gauge having a top and bottom surface with a circular recessed area centrally located within said bottom surface, said circular recessed area extending a first distance into said bottom surface to a planar surface disposed within said bottom surface of said gap gauge, said gap gauge further having a ramped surface disposed on said bottom surface peripherally surrounding said circular recessed area, said ramped surface having a first end and a second end, said first end positioned flush with said bottom surface of said gap gauge, said second end extending into said bottom surface such that said second end is flush with said planar surface, said ramped surface disposed making a single revolution around said circular recessed area, said ramped surface configured such that the distance which said ramped surface extends into said bottom surface towards said planar surface varies with the position of said ramped surface around said circular recessed area, said gap gauge having a handle located on said top surface thereof, said gap gauge disposed over said vacuum chuck means with said vacuum chuck means disposed within said circular recessed area of said gap gauge and with said ramped surface disposed in close proximity to said nozzle, said gap gauge having means for indicating the distance of said nozzle from said backside of said semiconductor wafer.

* * * * *